US009996206B2

(12) United States Patent
Okumura et al.

(10) Patent No.: US 9,996,206 B2
(45) Date of Patent: Jun. 12, 2018

(54) TOUCH PANEL

(71) Applicant: NISSHA PRINTING CO., LTD., Kyoto-shi, Kyoto (JP)

(72) Inventors: Kenji Okumura, Kyoto (JP); Yoshiro Fujii, Kyoto (JP); Seiko Hirai, Kyoto (JP)

(73) Assignee: Nissha Co., Ltd., Kyoto (JP)

( * ) Notice: Subject to any disclaimer, the term of this patent is extended or adjusted under 35 U.S.C. 154(b) by 0 days. days.

(21) Appl. No.: 15/537,539

(22) PCT Filed: Nov. 26, 2015

(86) PCT No.: PCT/JP2015/083182
§ 371 (c)(1),
(2) Date: Jun. 19, 2017

(87) PCT Pub. No.: WO2016/104035
PCT Pub. Date: Jun. 30, 2016

(65) Prior Publication Data
US 2017/0351356 A1    Dec. 7, 2017

(30) Foreign Application Priority Data

Dec. 26, 2014  (JP) .................................. 2014-265914

(51) Int. Cl.
*G06F 3/044* (2006.01)
*G02F 1/1343* (2006.01)
*G02F 1/1333* (2006.01)

(52) U.S. Cl.
CPC ............ *G06F 3/044* (2013.01); *G02F 1/1343* (2013.01); *G02F 1/13338* (2013.01); *G06F 2203/04112* (2013.01)

(58) Field of Classification Search
CPC ........... G06F 3/044; G06F 2203/04112; G06F 3/0412; G02F 1/1343; G02F 1/13338
See application file for complete search history.

(56) References Cited

U.S. PATENT DOCUMENTS

2011/0227866 A1 * 9/2011 Kawaguchi ............. G06F 3/041
345/174
2012/0170283 A1   7/2012 Kobayashi et al.
(Continued)

FOREIGN PATENT DOCUMENTS

JP    S58-182744 A       10/1983
JP    2012203565 A  *    3/2011
(Continued)

OTHER PUBLICATIONS

International Search Report in PCT/JP2015/083182 dated Feb. 9, 2016.
(Continued)

*Primary Examiner* — Ibrahim A Khan
(74) *Attorney, Agent, or Firm* — Global IP Counselors, LLP

(57) ABSTRACT

In a touch panel, a plurality of first transparent electrodes are formed on a first substrate film, and extend in one direction. A plurality of first wires are formed on the first substrate film, and are connected to the plurality of first transparent electrodes. A plurality of second transparent electrodes are formed to intersect the plurality of first transparent electrodes. A plurality of second lead wires are connected to the plurality of second transparent electrodes. First and second shield layers are formed on the first base-material film, and overlap the plurality of second lead wires in a planar view. The first and second shield layers each have a length range set to not include lengths of $\lambda$ of each of a plurality of frequencies within a specific range/n (n=2, 4, 6, . . . ), to not induce resonance phenomena with respect to the plurality of frequencies.

6 Claims, 3 Drawing Sheets

(56) References Cited

U.S. PATENT DOCUMENTS

| | | | | |
|---|---|---|---|---|
| 2012/0228020 A1* | 9/2012 | Winch | ................ | H05K 9/0043 |
| | | | | 174/378 |
| 2012/0281368 A1* | 11/2012 | Nicol | ................ | H05K 9/0054 |
| | | | | 361/736 |
| 2013/0242475 A1* | 9/2013 | Sloey | ................ | H01R 13/5202 |
| | | | | 361/679.01 |
| 2014/0028619 A1* | 1/2014 | Huang | ................ | H04B 1/3827 |
| | | | | 345/174 |
| 2015/0061942 A1 | 3/2015 | Koyama | | |
| 2015/0179588 A1* | 6/2015 | Choi | ................ | H01L 25/0657 |
| | | | | 257/659 |
| 2015/0189799 A1* | 7/2015 | Makelainen | ............ | G06F 3/044 |
| | | | | 345/174 |

FOREIGN PATENT DOCUMENTS

| | | |
|---|---|---|
| JP | 2012-203565 A | 10/2012 |
| WO | 2013/157420 A1 | 10/2013 |

OTHER PUBLICATIONS

Extended Search Report in the corresponding European Patent Application No. 15872604.2 dated Dec. 22, 2017.

\* cited by examiner

TOUCH PANEL

CROSS-REFERENCE TO RELATED APPLICATION

This U.S. National stage application claims priority under 35 U.S.C. § 119(a) to Japanese Patent Application No. 2014-265914, filed in Japan on Dec. 26, 2014, the entire contents of Japanese Patent Application No. 2014-265914 are hereby incorporated herein by reference.

BACKGROUND

Field of the Invention

The present invention relates to a touch panel.

Background Art

A capacitive touch panel is used to identify a detection point by measuring a capacitance variation generated when a touch panel surface is touched with an operating object such as a finger. In particular, a projection type touch panel includes a plurality of electrodes arranged to cross in X and Y directions. The electrodes are constituted of transparent conductive films, for example. Using the electrodes described above, a capacitance variation is measured so that coordinates of a detection point can be specified (see, for example, JP-A-2012-203565).

A touch panel sensor 60 described in JP-A-2012-203565 includes a first transparent conductive pattern 61 and a second transparent conductive pattern 62, as well as a first lead conductive pattern 63 and a second lead conductive pattern 64 electrically connected to the transparent conductive patterns. The first transparent conductive pattern 61 and the second transparent conductive pattern 62 are formed in a display area T0, while the first lead conductive pattern 63 and the second lead conductive pattern 64 are formed in a wiring area T1 in the periphery. In addition, the touch panel sensor 60 has a first terminal portion 65 and a second terminal portion 66 connected to the first lead conductive pattern 63 and the second lead conductive pattern 64, respectively.

SUMMARY

The touch panel sensor 60 described in JP-A-2012-203565 further includes a first shield pattern 71 and a second shield pattern 72. The first shield pattern 71 is disposed so as to correspond to the second lead conductive pattern 64. In this way, noise transmission to the second lead conductive pattern 64 is reduced. In addition, the second shield pattern 72 is disposed so as to correspond to the first lead conductive pattern 63. In this way, noise transmission to the first lead conductive pattern 63 is reduced.

However, the inventor of the present invention found a phenomenon that the above-mentioned structure may cause a noise peak generated in the touch panel by an electromagnetic wave in a use environment.

Therefore, the inventor of the present invention has pursued the cause of the above-mentioned phenomenon and invented novel means to solve the problem.

It is an object of the present invention to suppress a noise phenomenon due to an electromagnetic wave in a touch panel equipped with a shield layer corresponding to wiring pattern.

Aspects of the present invention are explained below as the technical solution. These aspects can be arbitrarily combined as needed.

According to one aspect of the present invention, a touch panel includes a substrate, a plurality of first detection electrodes, a plurality of first lead wires, a plurality of second detection electrodes, a plurality of second lead wires, and a shield layer.

The plurality of first detection electrodes are formed on the substrate and extend in one direction.

The plurality of first lead wires are formed on the substrate and are connected to the plurality of first detection electrodes.

The plurality of second detection electrodes are formed so as to cross the plurality of first detection electrodes.

The plurality of second lead wires are connected to the plurality of second detection electrodes.

The shield layer is formed on the substrate so as to overlap the plurality of second lead wires in a plan view, length ranges of the shield layer being set, in order that a resonance phenomenon does not occur at a plurality of frequencies in a specific range, not to include lengths equal to $\lambda/n$ (n=2, 4, 6, . . . ) related to each of the frequencies. Note that the state where the shield layer overlaps with the plurality of second lead wires in the plan view means a state where at least partially they are overlapped with each other.

In this touch panel, since length of the shield layer satisfies the above-mentioned condition, the shield layer hardly resonate with an electromagnetic wave. Therefore, noise is hardly generated in the plurality of first lead wires.

The shield layer may include a first shield layer and a second shield layer insulated from the first shield layer.

Length ranges of the first shield layer and the second shield layer may be set not to include lengths equal to $\lambda/n$ (n=2, 4, 6, . . . ) related to each of the frequencies.

In this touch panel, when forming the first shield layer and the second shield layer, it is possible to form both of them as one continuous layer by screen printing, and then to divide it into two parts, for example, so that the first shield layer and the second shield layer can be obtained.

The shield layer may be disposed in a periphery of the substrate so as to surround the plurality of first detection electrodes and the plurality of first lead wires.

If the shield layer is disposed in the periphery of the first substrate film so as to surround the first transparent electrodes and the plurality of first lead wires, conventionally, noise may occur in the first lead wires due to resonance in the shield layer, and a cause thereof is assumed to be that a distance between a part of the shield layer and a part of the first lead wire facing each other is small while facing lengths of them are large. Therefore, in this touch panel, length of the shield layer is set to satisfy the condition described above, so as to prevent occurrence of resonance in the shield layer. As a result, a noise hardly occurs in the first lead wires.

According to a touch panel of the present invention, a noise phenomenon due to an electromagnetic wave can be suppressed.

DESCRIPTION OF EMBODIMENTS

1. First Embodiment

Figure 1:
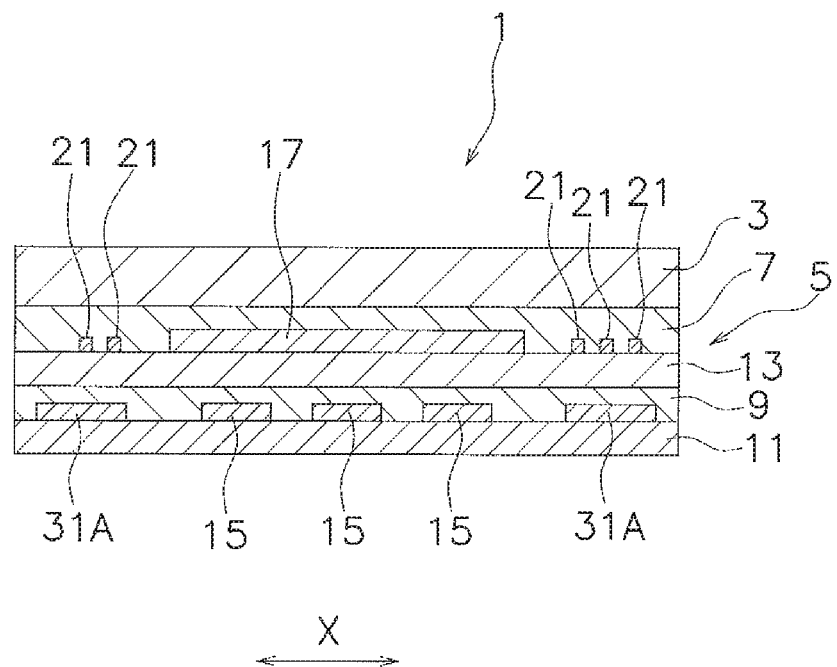
FIG. 1 is a cross-sectional view of a touch panel according to an embodiment of the present invention.

A touch panel 1 illustrated in FIG. 1 includes a cover member 3 and a film sensor 5 adhered to a back surface side of the cover member 3.

A material of the cover member 3 is required to have high transparency and resistance to impact applied. For example, a glass plate or a resin plate can be used. As a material of the glass plate, it is preferred to use chemically reinforced glass. As a material of the resin plate, it is preferred to use an acrylic resin, a polycarbonate resin, or the like.

The film sensor 5 is adhered to the above-mentioned cover member 3 by using a first optical clear adhesive (OCA) 7. In this embodiment, the optical clear adhesive 7 is applied to at least a back surface of the cover member 3. There are an acrylic type and a rubber type as the optical clear adhesive 7, and the acrylic type is preferred because of its transparency.

The film sensor 5 has a basic structure including a first substrate film 11 (an example of a substrate), a second substrate film 13, a plurality of first transparent electrodes 15 (an example of first detection electrodes), a plurality of second transparent electrodes 17 (an example of second detection electrodes), a plurality of first lead wires 19 (an example of first lead wires), and a plurality of second lead wires 21 (an example of second lead wires). In this embodiment, a mutual capacitance type is adopted as the film sensor 5, and the first transparent electrodes 15 and the second transparent electrodes 17 are strip electrodes arranged in a matrix.

The first substrate film 11 and the second substrate film 13 are arranged in the up and down direction. In this embodiment, the first substrate film 11 is disposed at a lower side while the second substrate film 13 is disposed at an upper side.

The first substrate film 11 and the second substrate film 13 are adhered to each other with a second optical clear adhesive 9 therebetween.

The plurality of first transparent electrodes 15 are arranged in parallel with each other on the first substrate film 11. The plurality of first transparent electrodes 15 are formed on the first substrate film 11 so as to extend in the Y direction and are arranged with predetermined spaces in the X direction with each other.

The plurality of second transparent electrodes 17 are formed on the second substrate film 13. The plurality of second transparent electrodes 17 are formed so as to cross (preferably perpendicularly) the plurality of first transparent electrodes 15. The second transparent electrodes 17 extend in the X direction and are arranged in the Y direction with predetermined spaces with each other.

Note that the first transparent electrodes 15 and the second transparent electrodes 17 are not limited to have a linear shape but may have a wave-like shape or a shape with varying thickness.

The first transparent electrodes 15 and the second transparent electrodes 17 constitute a part that functions as a sensing electrode (sensing portion) for sensing a capacitance variation in the touch panel 1. In other words, when a fingertip contacts with the touch panel 1, a mutual capacitance between the first transparent electrode 15 and the second transparent electrode 17 varies, and based on this variation a position of the fingertip is calculated by a detection circuit of a detection control unit (not shown).

Note that three first transparent electrodes 15 and six second transparent electrodes 17 are disposed in this embodiment, but they are not limited to particular numbers as long as they are plural.

Figure 2:
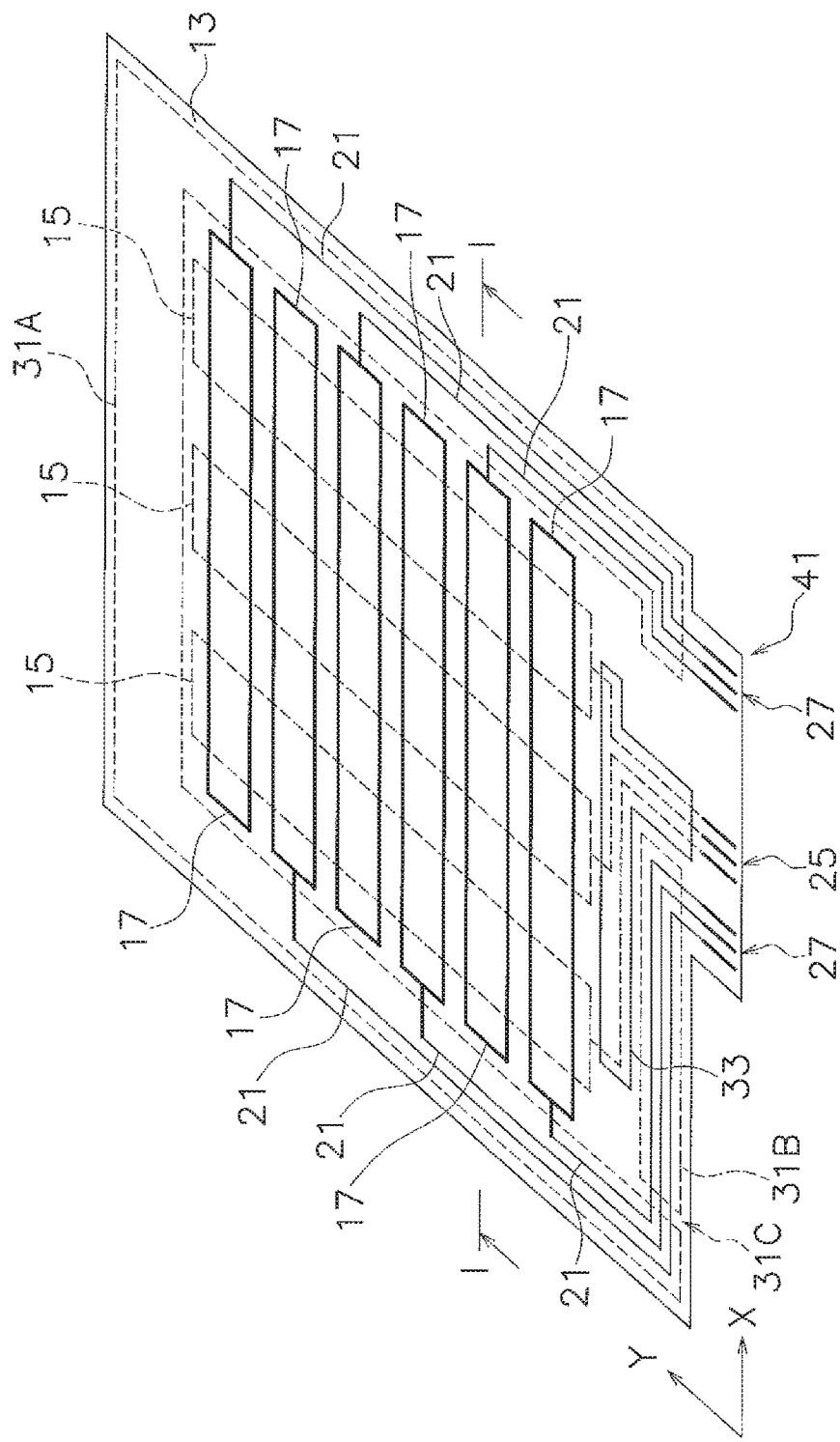
FIG. 2 is a schematic perspective view for explaining a relationship among electrode patterns.
Figure 3:
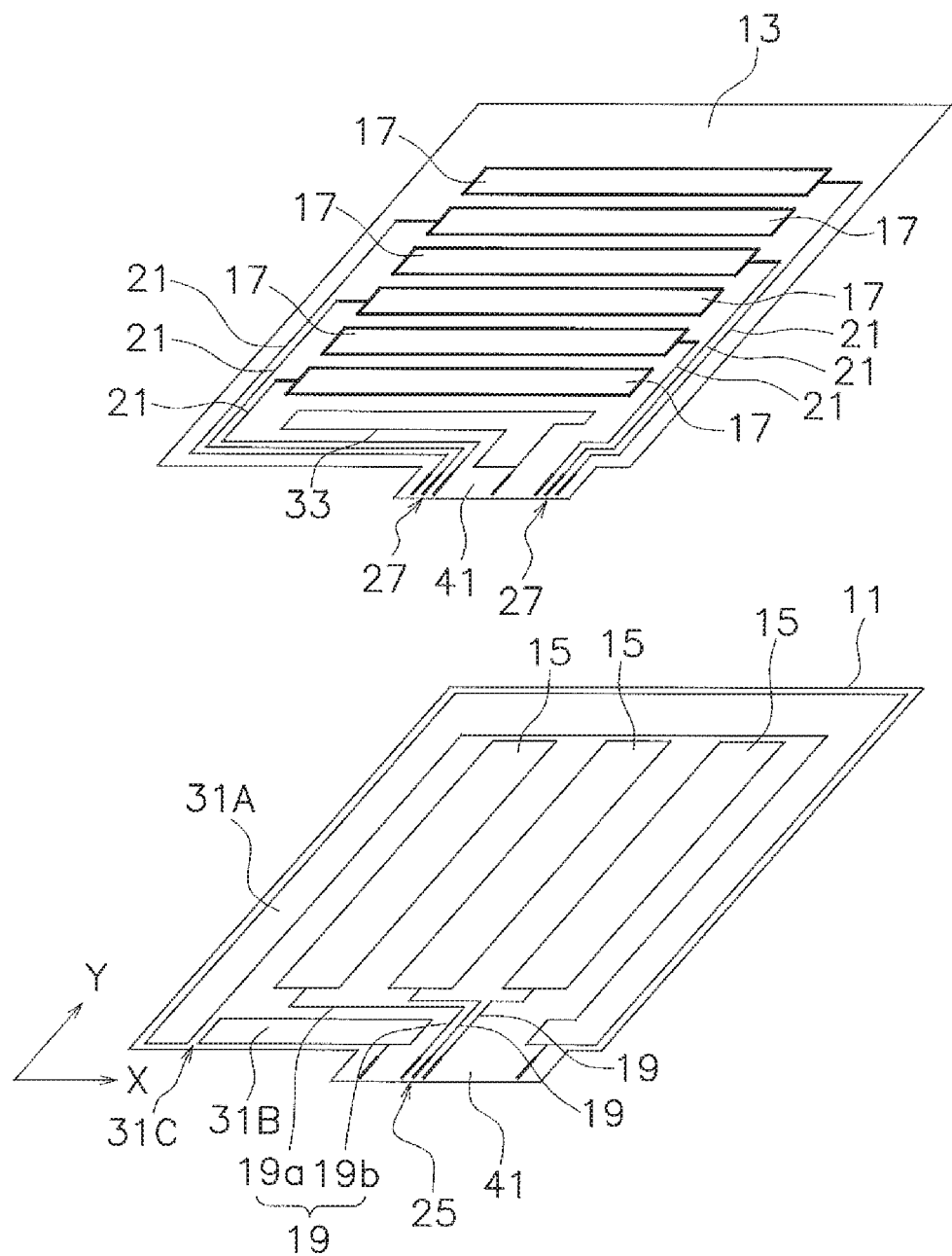
FIG. 3 is a schematic perspective view for explaining a relationship between first electrode pattern and second electrode pattern.

The plurality of first lead wires 19 are formed on the first substrate film 11. The plurality of first lead wires 19 are connected to the plurality of first transparent electrodes 15, respectively. The plurality of first lead wires 19 extend within a non-display area in the periphery on the first substrate film 11. The plurality of first lead wires 19 extend to reach a connection terminal 25. In this embodiment, the first lead wires 19 extend from one end in the Y direction of the first transparent electrode 15 to an edge of the first substrate film 11, and the length thereof is relatively short. However, as illustrated in FIGS. 2 and 3, the connection terminal 25 is shifted to one side in the X direction. Accordingly, the first lead wire 19 extending from the farthest side in the X direction from the connection terminal 25 includes a first part 19a that is relatively long in the X direction and a second part 19b extending from the first part 19a in the Y direction.

The plurality of second lead wires 21 are formed on the second substrate film 13. The plurality of second lead wires 21 are connected to the second transparent electrode 17, respectively. The plurality of second lead wires 21 extend to reach a connection terminal 27. In this embodiment, the second lead wires 21 are led out alternately from both ends in the X direction of the second transparent electrode 17 and further extend in the Y direction to the edge of the first substrate film 11, and the length thereof is relatively long.

Note that the connection terminal 25 and the connection terminal 27 are disposed at extension parts 41 of the first substrate film 11 and the second substrate film 13, respectively. The connection terminal 25 and the connection terminal 27 are connected to a flexible printed circuit board (not shown) and are electrically connected to the detection circuit of the detection control unit (not shown).

The first transparent electrodes 15 and the second transparent electrodes 17 are arranged to form a grid in a plan view. For example, the first transparent electrodes 15 function as transmission-side electrodes, while the second transparent electrodes 17 function as reception-side electrodes. When a user's finger or the like does not touch with or approach to the cover member 3 covering the film sensor 5, there is formed an electric field having electric flux lines from the first transparent electrode 15 on the transmission side to the second transparent electrode 17. When the user's finger or the like touches with or approaches the cover member 3, which covers the film sensor 5, a part of the electrical flux lines run around the second transparent electrode 17 and are absorbed by the finger or the like. As a result, the mutual capacitance varies, and the coordinates at which the mutual capacitance varies is detected as the detection point. The detection circuit of the detection control unit detects the variation of the capacitance generated in this case, and it can obtain a set of an X coordinate value and a Y coordinate value as specified values for identifying the touched position in a transparent area.

As a material for the first substrate film 11 and the second substrate film 13, a film made of a thermoplastic transparent resin having transparency such as polyester (PET), polyimide (PI), polyethersulfone (PES), polyetheretherketone (PEEK), polycarbonate (PC), polypropylene (PP), polyamide (PA), polyacrylate (PAC), norbomene, or the like, or a laminate thereof is used. It is also possible to use cycloolefin polymer (COP).

The first substrate film 11 and the second substrate film 13 have a thickness of usually 20 μm or more as a single thickness of each film, and a total thickness of the films used for the film sensor 5 is 500 μm or less. If the single thickness is less than 20 μm, it is difficult to handle when manufacturing the film. If the total thickness is more than 500 μm, transparency is deteriorated.

As a material of the first transparent electrode 15 and the second transparent electrode 17, it is preferred to use a material having a light transmittance (transparency) of 80% or more and a surface resistance (conductivity) of a few megohms to a few hundred ohms. For example, it is possible to form the film by using a metallic oxide such as indium oxide, tin oxide, indium tin oxide (ITO), or tin antimony acid, or a metal such as gold, silver, copper, platinum, palladium, aluminum, or rhodium. As a method of forming the first transparent electrode 15 and the second transparent electrode 17 made of the above-mentioned material, there are a method of patterning by etching after forming a transparent conductive film by a PVD method such as a sputter method, a vacuum evaporation method, or an ion plating method, a CVD method, a coating method, or the like, a printing method, and the like.

The first lead wires 19 and the second lead wires 21 are usually formed by screen printing, but the forming method is not limited in particular. As a material of the first lead wires 19 and the second lead wires 21, silver paste, copper paste, or silver and carbon ink is usually used, but other material may be used as long as it is a stable material that can keep the volume resistance.

In addition, the first lead wires 19 and the second lead wires 21 may have a two-layered structure including a transparent conductive layer made of the same material as the first transparent electrode 15 and the second transparent electrode 17, and a metal layer formed on the transparent conductive layer. As a material of the metal layer, there are aluminum, nickel, copper, silver, tin, and the like. As a method of forming the first lead wires 19 and the second lead wires 21, there is a method of patterning by etching after forming a transparent conductive film and a metal film by a PVD method such as a sputter method, a vacuum evaporation method, or an ion plating method, a CVD method, a coating method, or the like.

The touch panel 1 further includes, as an example of a shield layer, a first shield layer 31A and a second shield layer 31B. The first shield layer 31A and the second shield layer 31B are formed on the first substrate film 11. The first shield layer 31A and the second shield layer 31B are arranged to overlap with the plurality of second lead wires 21 in the plan view. Note that the state where the first shield layer 31A and the second shield layer 31B overlap with the plurality of second lead wires 21 in the plan view means a state where at least partially they are overlapped with each other. In this embodiment, the first shield layer 31A and the second shield layer 31B covers substantially the entire of the plurality of second lead wires 21.

One end of each of the first shield layer 31A and the second shield layer 31B is connected to a ground line.

The first shield layer 31A and the second shield layer 31B can be replaced with one filled entirely or in a mesh shape with a transparent conductive film made of the same material as the first transparent electrode 15.

The first shield layer 31A extends from a first corner of the first substrate film 11 (lower right in FIG. 2) through a second corner (upper right in FIG. 3) and a third corner (upper left in FIG. 2) to a fourth corner (lower left in FIG. 2), and one end thereof near the first corner is connected to the ground line.

The second shield layer 31B extends in the X direction from a vicinity of a distal end of the first shield layer 31A (namely, a vicinity of the fourth corner of the first substrate film 11). Therefore the second shield layer 31B is near the first part 19a and the second part 19b of the leftmost first lead wire 19 in the diagram. There is a gap 31C formed between the second shield layer 31B and the first shield layer 31A, and hence they are insulated from each other.

When forming the first shield layer 31A and the second shield layer 31B, it is possible to form both of them as one continuous layer by screen printing, and then to divide it into two parts, for example, so that the first shield layer 31A and the second shield layer 31B can be obtained.

The first shield layer 31A and the second shield layer 31B satisfy the following length condition.

Length ranges of the first shield layer 31A and the second shield layer 31B are set, in order that a resonance phenomenon does not occur at a plurality of frequencies in a specific range, not to include lengths equal to $\lambda/n$ (n=2, 4, 6, . . . ) related to each of the frequencies.

For example, $f=c/\lambda$ holds, where c represents the speed of an electromagnetic wave, which is $3\times10^8$ m, and $\lambda$ represents a wavelength that is the product of n and the length (n=2, 4, 6, . . . ).

As an example of a target frequency band is 100 MHz to 400 MHz in a TEM cell method. A TEM cell test is one of on-board equipment tests and is an immunity test with respect to electromagnetic waves of radio/TV broadcasting, transceivers, armature radios, and the like. In the TEM cell test, an assumed electromagnetic wave is radiated in a TEM cell, and it is checked whether or not an on-board product is affected.

100 MHz to 400 MHz are substituted into the above equation. In a case of $\lambda/4$ (n=4), $3\times10^8/100\times10^6/4$ is equal to 750 mm, and $3\times10^8/400\times10^6/4$ is equal to 187.5 mm. Therefore, it is understood that it is preferred to avoid a length range from 187.5 mm to 750 mm of the shield layer.

Therefore, for example, it is preferred that the first shield layer 31A should exceed 750 mm while the second shield layer 31B should be less than 187.5 mm. Further, as the length of the shield layer is shorter, magnetic permeability affects more to the resonance of the shield layer. Therefore, it is preferred that the second shield layer 31B should be less than 100 mm.

In this touch panel 1, lengths of the first shield layer 31A and the second shield layer 31B satisfy the above-mentioned condition, and hence the first shield layer 31A and the second shield layer 31B hardly resonate with an electromagnetic wave. Therefore noise is hardly generated in the plurality of first lead wires 19.

Note that the frequencies and the lengths of the shield layer described above are merely examples, and the present invention is not limited to this embodiment.

The touch panel 1 further includes a third shield layer 33. The third shield layer 33 is formed on the second substrate film 13. The third shield layer 33 is arranged to overlap the plurality of first lead wires 19 in the plan view. Note that the state where the third shield layer 33 overlap with the plurality of first lead wires 19 in the plan view means a state where at least partially they are overlapped with each other. In this embodiment, the third shield layer 33 covers substantially the entire of the plurality of first lead wires 19. Note that the third shield layer 33 has a small area only in a part on one side in the Y direction of the sensing portion.

The third shield layer 33 is connected to the ground line.

The third shield layer 33 can be filled entirely or in a mesh shape with a transparent conductive film made of the same material as the second transparent electrode 17.

As described above, the first shield layer 31A and the second shield layer 31B are disposed in the periphery of the first substrate film 11 so as to surround the first transparent electrode 15 and the plurality of first lead wires 19. Conventionally, if the shield layer does not satisfy the length condition described above, noise may occur in the first lead wires 19 due to resonance in the shield layer, and a cause thereof is assumed to be that a distance between a part corresponding to the second shield layer 31B and the first part 19a as well as the second part 19b of the first lead wire 19 is small while facing lengths of them are large. Therefore, in this touch panel 1, lengths of the first shield layer 31A and the second shield layer 31B are set to satisfy the condition described above, so as to prevent occurrence of resonance in the shield layer, which may occur conventionally.

2. Other Embodiments

Although the embodiment of the present invention is described above, the present invention is not limited to the embodiment described above but can be variously modified within the scope of the invention without deviating from the spirit thereof. In particular, a plurality of embodiments and variations described in this specification can be arbitrarily combined as necessary.

Although the first shield layer 31A and the second shield layer 31B are formed on the first substrate film 11 in the embodiment described above, the present invention is not limited to this embodiment. There may be a single shield layer or three or more shield layers.

Although the first shield layer 31A and the second shield layer 31B are cut off near the fourth corner of the first substrate film 11 in the embodiment, the cutting point and the cutting shape are not particularly limited.

Although the first shield layer 31A and the second shield layer 31B are separated by cutting, the present invention is not limited to this embodiment. The first shield layer 31A and the second shield layer 31B may be patterned so as not to be connected to each other by screen printing, for example.

Although the first shield layer 31A and the second shield layer 31B are formed on the first substrate film, they may be formed on the second substrate film.

Although the mutual capacitance type touch panel is adopted in the embodiment described above, the present invention is not limited to this embodiment. It is also possible to adopt a self-capacitance type touch panel including rhombus transparent electrodes arranged to be spread over.

Although the connection terminal 25 is shifted to one side in the X direction in the embodiment described above, the connection terminal 25 may be disposed in a central part in the X direction.

Although the two types of transparent electrodes are respectively disposed on the first substrate film and the second substrate film in the layers on the same side in the embodiment described above, the present invention is not limited to this embodiment. For example, the two types of transparent electrodes may be respectively disposed on the opposite surfaces of the first substrate film and the second substrate film.

Although the two types of transparent electrodes are respectively disposed on the two substrate films in the embodiment described above, the present invention is not limited to this embodiment. For example, the two types of transparent electrodes may be disposed on one side or on both sides of a single substrate film.

Although the first substrate film and the second substrate film are directly adhered to each other in the embodiment described above, the present invention is not limited to this embodiment. For example, one or more substrate films may be disposed between the first substrate film and the second substrate film.

The present invention can be widely applied to touch panels.

The invention claimed is:

1. A touch panel comprising:
a substrate;
a plurality of first detection electrodes formed on the substrate and extending in one direction;
a plurality of first lead wires formed on the substrate and connected to the plurality of first detection electrodes;
a plurality of second detection electrodes firmed so as to cross the plurality of first detection electrodes;
a plurality of second lead wires connected to the plurality of second detection electrodes, the plurality of second lead wires extending to reach a connection terminal connected to a flexible printed circuit board; and
a first shield layer formed on the substrate and extending so as to overlap the plurality of second lead wires in a plan view, an extending length of the first shield layer being set, in order that a resonance phenomenon does not occur at a plurality of frequencies in a specific range,
the extending length of the first shield layer being more than 750 mm.

2. The touch panel according to claim 1, further comprising
a second shield layer insulated from the first shield layer, the second shield layer being formed on the substrate and extending so as to overlap the plurality of second lead wires in the plan view, an extending length of the second shield layer being set, in order that a resonance phenomenon does not occur at a plurality of frequencies in a specific range,
the extending length of the second shield layer being less than 187.5 mm.

3. The touch panel according to claim 1, wherein
the first shield layer is disposed in a periphery of the substrate so as to surround the plurality of first detection electrodes and the plurality of first lead wires.

4. The touch panel according to claim 2, wherein
the first shield layer is disposed in a periphery of the substrate so as to surround the plurality of first detection electrodes and the plurality of first lead wires.

5. The touch panel according to claim 3, wherein
the first shield layer has a U-like shape so as to surround the plurality of first detection electrodes and the plurality of first lead wires.

6. The touch panel according to claim 4, wherein
the first shield layer has a U-like shape so as to surround the plurality of first detection electrodes and the plurality of first lead wires.

* * * * *